(12) United States Patent
Lin et al.

(10) Patent No.: US 8,854,326 B2
(45) Date of Patent: Oct. 7, 2014

(54) TOUCH PANEL AND TOUCH-SENSITIVE DISPLAY DEVICE

(75) Inventors: Yi-Chun Lin, Nan Tou County (TW);
Ming-Kung Wu, Tai Chung (TW);
Hsiao-Ping Li, Tai Chung (TW);
Ping-Wen Huang, Tai Chung (TW);
Cheng-Yi Chou, Yun Lin County (TW);
Yu-Hua Wu, Tao Yuan County (TW);
Xuan-Chang Shiu, Chang Hua County (TW); Chih-Yuan Wang, Tai Chung County (TW); Ching-Fu Hsu, Tai Chung County (TW); Shiao-Hui Liao, Taichung (TW); Ting-Yu Chang, Kao Hsiung County (TW); Fa-Chen Wu, Tai Chung (TW); Wen-Chun Wang, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 13/493,524

(22) Filed: Jun. 11, 2012

(65) Prior Publication Data
US 2012/0249465 A1 Oct. 4, 2012

Related U.S. Application Data

(63) Continuation-in-part of application No. 13/045,105, filed on Mar. 10, 2011.

(51) Int. Cl.
G06F 3/041 (2006.01)
(52) U.S. Cl.
CPC ...... *G06F 3/041* (2013.01); *G06F 2203/04103* (2013.01)
USPC .......................................... 345/173; 345/174

(58) Field of Classification Search
USPC .................................. 345/173–183; 156/249
See application file for complete search history.

(56) References Cited

U.S. PATENT DOCUMENTS

| | | | |
|---|---|---|---|
| 2005/0269943 A1* | 12/2005 | Hack et al. | 313/504 |
| 2008/0165158 A1 | 7/2008 | Hotelling et al. | |
| 2009/0219260 A1* | 9/2009 | Bick | 345/173 |
| 2009/0315855 A1* | 12/2009 | Oikawa et al. | 345/174 |
| 2010/0007616 A1 | 1/2010 | Jang | |
| 2010/0311490 A1* | 12/2010 | Miller et al. | 463/16 |
| 2012/0212445 A1* | 8/2012 | Heikkinen et al. | 345/174 |

FOREIGN PATENT DOCUMENTS

| | | |
|---|---|---|
| CN | 101408820 | 4/2009 |
| CN | 101410779 | 4/2009 |
| TW | M337793 | 8/2008 |
| TW | 20125400 | 2/2012 |

* cited by examiner

*Primary Examiner* — Kevin M Nguyen
*Assistant Examiner* — Kenneth B Lee, Jr.
(74) *Attorney, Agent, or Firm* — Muncy, Geissler, Olds & Lowe, P.C.

(57) ABSTRACT

A touch panel structure and the manufacturing method thereof are disclosed, in which the manufacturing method includes the steps of: providing a bonding layer; and forming a conductive pattern layer on the bonding layer; wherein the conductive pattern layer is composed of at least one first and at least one second major conductors with an insulation layer interposed between the first and the second major conductors. Comparing with the prior art for manufacturing touch panels, the disclosure is advantageous in material cost, production cost, and production yield; moreover, the panel lamination process can be simplified and the touch panel structure can be joined to a planar or curvy panel and facilitate the design of a thinner product.

24 Claims, 23 Drawing Sheets

TOUCH PANEL AND TOUCH-SENSITIVE DISPLAY DEVICE

CROSS-REFERENCE TO RELATED APPLICATIONS

This application is a continuation-in-part of application Ser. No. 13/045,105, filed on Mar. 10, 2011.

TECHNICAL FIELD

The present invention relates to a touch panel structure, a touch-sensitive display device and the manufacturing method thereof, and more particularly, to a touch panel structure formed on a bonding layer, which can be joined to a panel of arbitrary curvature and simplifies manufacturing process of touch panel devices.

TECHNICAL BACKGROUND

Conventional touch panel structures, whether a single-panel or double-panel type, was fabricated by the screen-printing or photolithography process on a transparent conductive substrate. Generally the transparent conductive substrate is composed of glass or plastic, and is expensive. Once a touch panel in the fabrication process fails, the transparent conductive substrate will be scrapped with the touch panel and cannot be recycled any more. It is difficult also for a transparent conductive substrate to be formed as a curvy surface.

Moreover, a protective lens needs to be attached and assembled with the touch panel to be a finished product. Conventionally, the protective lens and the touch panel were fabricated separately, and then assembled together in a proper structure order. The assembling process is complex and tends to decrease yield and to increase the whole thickness of a touch panel. Besides, the attachment of a protective lens onto the touch panel is attributed to a key process of bonding rigid panels. This process is difficult and even need to be outsourced to the Original Equipment Manufacturer (OEM).

TECHNICAL SUMMARY

To improve the remaining drawbacks of the prior arts, the primary objective of the present disclosure is to provide a touch panel structure and its manufacturing method, which forms a touch-panel conductor structure layer on a bonding layer to be joined to a planar or curvy panel of arbitrary curvature, so as to lower the material and production costs, improve the production yield, and simplify the panel lamination procedures in the manufacturing process, and, furthermore, to facilitate design of a thinner product.

According to one aspect of the present invention, the disclosure provides a touch panel structure, comprising: a bonding layer; and a conductive pattern layer formed on the bonding layer and comprising at least one first major conductor, at least one second major conductor, and an insulation layer interposed between the first and second major conductors.

According to another aspect of the present invention, the disclosure provides a method for manufacturing a touch panel, comprising the steps of: providing a transparent conductive film, a bonding layer, and a temporary base film, wherein the transparent conductive film is joined to one side of the bonding layer, and the temporary base film is joined to the other side of the bonding layer; patterning the transparent conductive film to form a conductive pattern layer; forming a protective layer on the conductive pattern layer; coating a protective covering film on the protective layer; and peeling off the temporary base film to disclose the bonding layer, and sticking the bonding layer on a planar or curvy panel.

According to another aspect of the present invention, the disclosure further provides another method for manufacturing a touch panel, comprising the steps of providing a first transparent conductive film, a first bonding layer, and a first temporary base film, wherein the first transparent conductive film is joined to one side of the first bonding layer, and the first temporary base film is joined to the other side of the first bonding layer; patterning the first transparent conductive film to form a first conductive pattern layer; providing a second transparent conductive film, a second bonding layer, and a second temporary base film, wherein the second transparent conductive film is joined to one side of the second bonding layer, and the second temporary base film is joined to the other side of the second bonding layer; patterning the second transparent conductive film to form a second conductive pattern layer; forming a protective layer on the second conductive pattern layer; coating a protective covering film on the protective layer; and peeling off the second temporary base film to disclose the second bonding layer, and sticking the second bonding layer on the first conductive pattern layer.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

The principles of the embodiments are described for illustrative purposes. However, one of ordinary skill in the art would readily recognize that the same principles are equally applicable to and can be implemented with variations that do not depart from the spirit and scope of the embodiments. In the following detailed description, references are made to the accompanying figures that illustrate specific embodiments.

Figure 1:
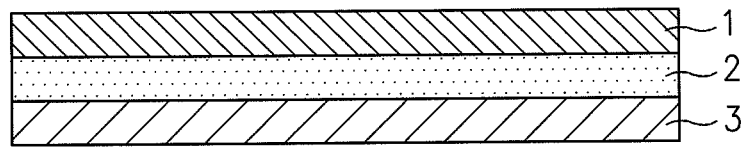
FIGS. 1 to 7 show evolutionary steps of fabrication process of a single-panel touch panel structure, according to the first embodiment of the present invention.
Figure 2:
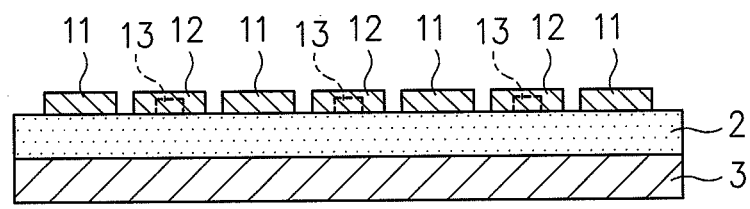
Figure 3:
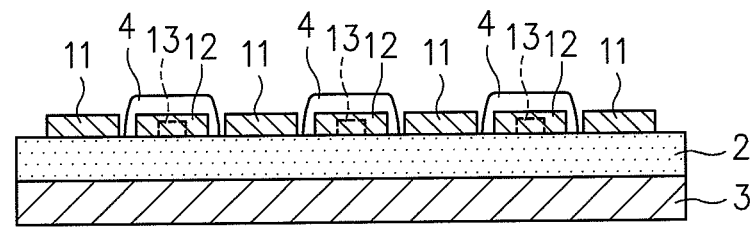
Figure 4:
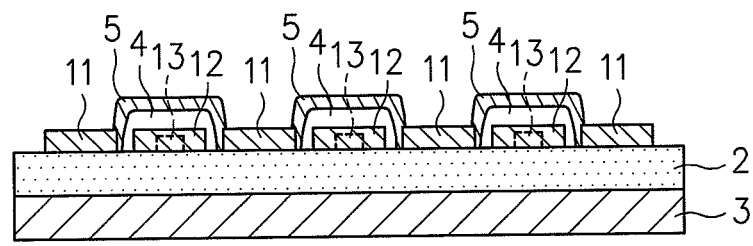
Figure 5:
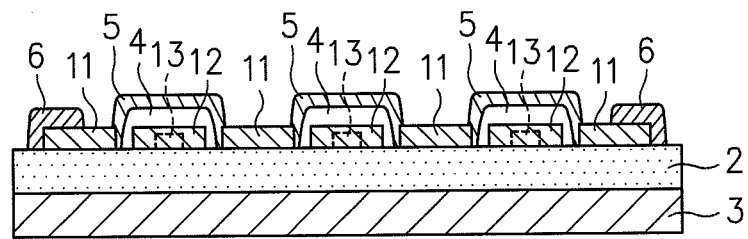
Figure 6:
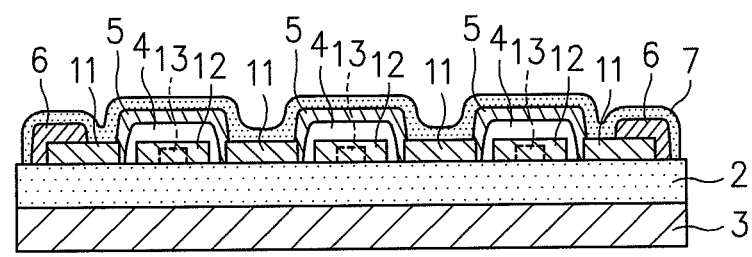

FIGS. 1 to 7 schematically illustrate evolutionary steps of fabrication process of a single-panel touch panel structure according to a first embodiment of the present invention. Referring to FIG. 1, a transparent conductive layer 1 is formed on upper side of a bonding layer 2, which is composed of transparent photo-curing adhesive. A temporary base film 3 is joined to the lower side of the bonding layer 2. The transparent conductive layer 1 is patterned by means of the wet or dry etching process to form a plurality of first major conductors 11, a plurality of second major conductors 12, and a plurality of second conductive wires 13, wherein each of the first major conductors 11 alternates with each of the second major conductors 12, and the second conductive wires 13 are connected with the second major conductors 12, as shown in FIG. 2. On the second conductive wires 13, an insulation layer 4 is formed by means of the ink-jet printing, screen-printing, physical vapor deposition (PVD), or chemical vapor deposition (CVD), to isolate the first major conductors 11 and the second major conductors 12, as shown in FIG. 3. On the insulation layer 4, a plurality of first conductive wires 5 are formed by means of the ink-jet printing, screen-printing, PVD or CVD, to connect electrically the adjacent first major conductor elements 11 like a bridge, as shown in FIG. 4. On edges of the bonding layer 2, first conductive routing leads 6 are formed to connect electrically the first major conductors 11, as shown in FIG. 5. It should be noticed that second conductive routing leads 161 are formed at the same time to connect electrically the second major conductors 12, as shown in FIG. 8. The first conductive routing leads 6 and the second conductive routing leads 161 are formed by means of ink-jet printing, screen-printing, PVD, or CVD, on the bonding layer 2. Thus, the first major conductors 11, the second major conductors 12, the second conductive wires 13, the insulation layer 4, the first conductive wires 5, the first conductive routing leads 6 and the second conductive routing leads 161 structure a conductive pattern layer. A protective layer 7 is formed on the conductive pattern layer, as shown in FIG. 6, and then a protective covering film 8 is coated on the protective layer 7. The protective layer 7 is mainly used to prevent the conductive pattern layer from being scraped and to improve optical performance of the device. The protective covering film 8 is mainly used to increase the overall thickness to facilitate peeling off the temporary base film, except for its protection function. It is noticed that the protective covering film 8 can be peeled off.

FIG. 8 shows a schematic layout of a single-panel touch panel according to the first embodiment. The single-panel touch panel 100 comprises a plurality of first major conductors 111 and a plurality of second major conductors 112. The first major conductors 111 are composed of five rows of transverse conductor array elements, wherein the elements in each row of the array are connected via first conductive wires 105, and the edge elements of each row are connected to the first conductive routing leads 106. The first major conductors 111, the first conductive wires 105, and the first conductive routing leads 106 correspond to the first major conductors 11, the first conductive wires 5, and the first conductive routing leads 6 in FIG. 7, respectively. On the other hand, the second major conductors 112 are composed of five columns of longitudinal conductor array elements, wherein the elements in each column of the array are connected via second conductive wires 113. An insulation layer 104 is then coated on the second conductive wires 113, so that the second conductive wires 113 will not contact electrically with the conductive wires 105. The second conductive routing leads 161 are disposed to connect the edge elements of the second major conductors 112 with external circuits. The second major conductors 112, the second conductive wires 113, and the insulation layer 104 respectively correspond to the second major conductors 12, the second conductive wires 13, and the insulation layer 4 in FIG. 7. The first conductive wires 105, the second conductive wires 113, the first conductive routing leads 106, and the second conductive routing leads 161 are formed by means of the ink-jet printing, screen-printing, PVD, or CVD. This embodiment illustrates the feasibility for the single-panel touch panel and its manufacturing method according to the present invention.

Figure 7:
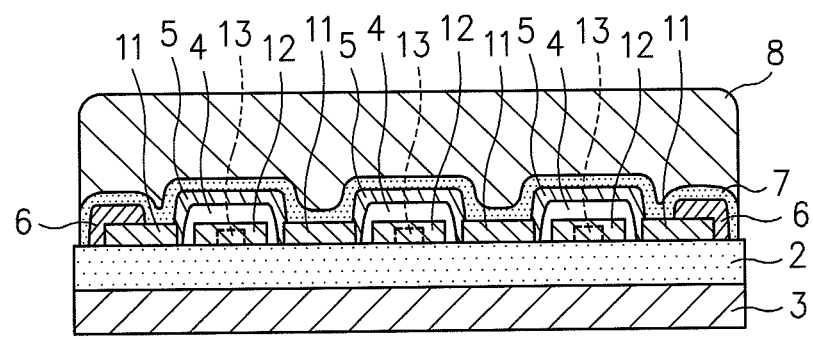
Figure 8:
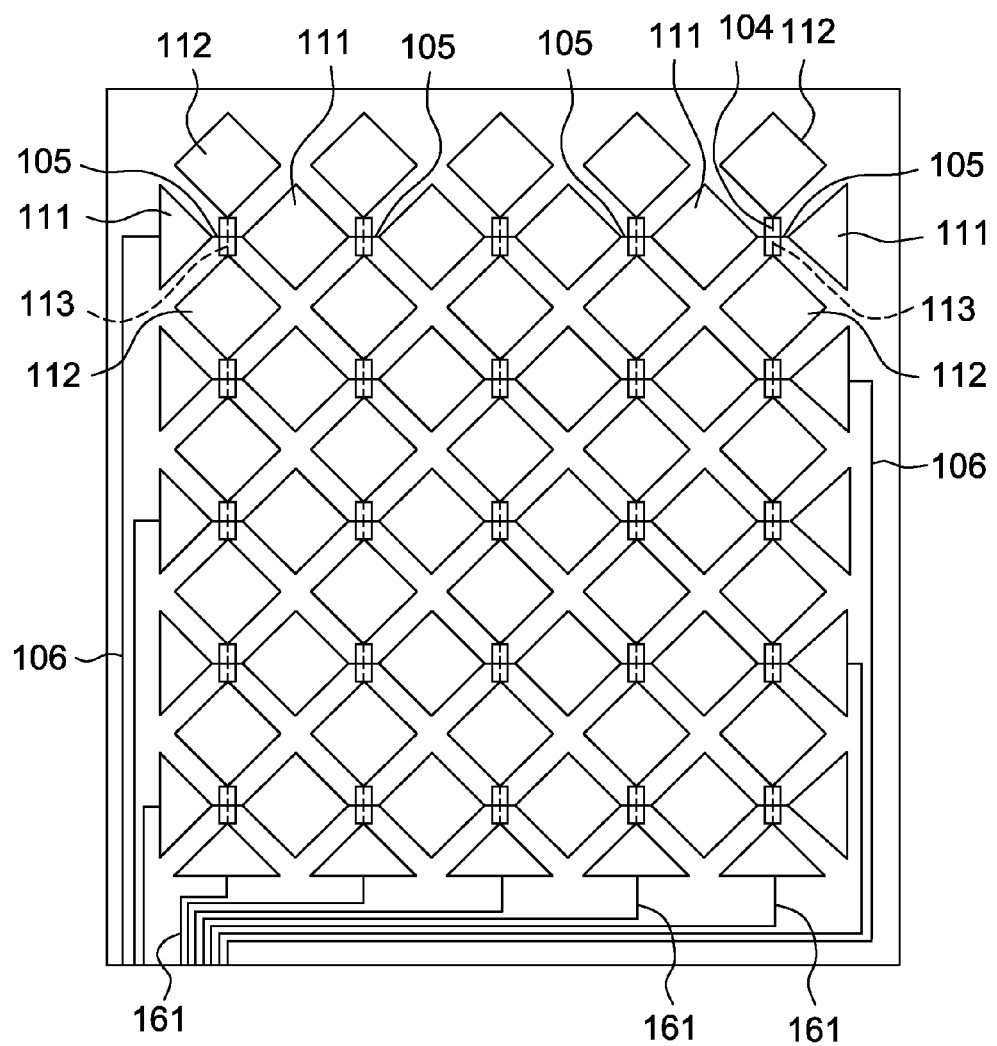
FIG. 8 shows a schematic layout of a single-panel touch panel according to the first embodiment.
Figure 9:
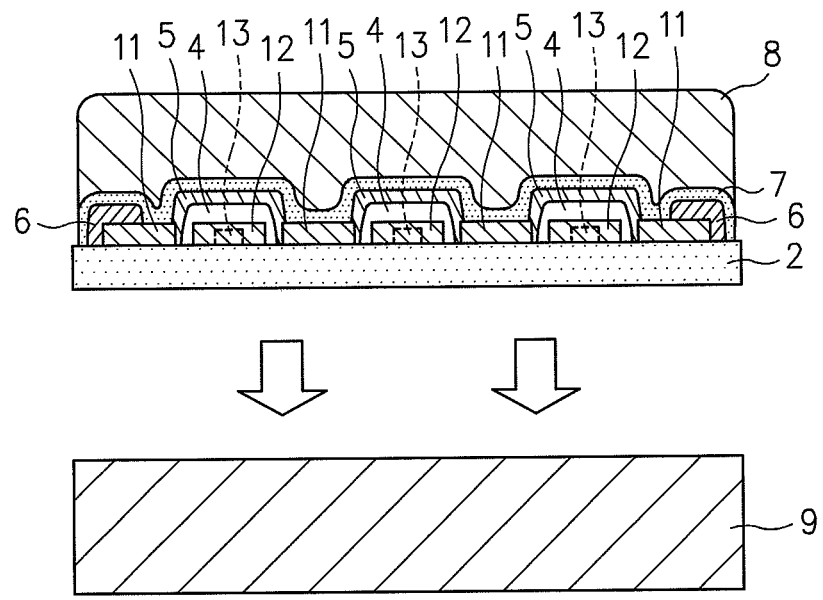
FIG. 9 schematically illustrates that bonding the conductive pattern layer onto a planar panel according to the first embodiment.
Figure 10:
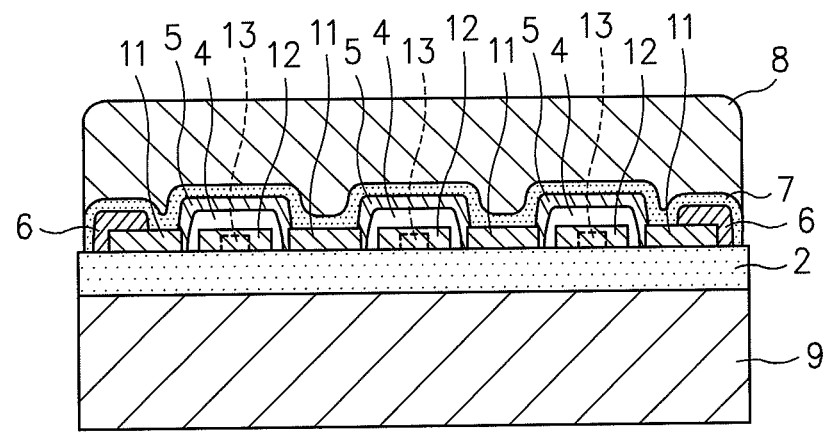
FIG. 10 shows the conductive pattern layer bonded to the planar panel according to the first embodiment.

FIG. 9 schematically illustrates the step of bonding the conductive pattern layer after peeling the temporary base film 3 off the touch panel structure as in FIG. 7 onto the surface of an object 9, according to the first embodiment. The result is shown in FIG. 10. The object 9 can be a lens, a display panel, and a glass or plastic substrate. After all, the protective covering film 8 can be peeled off.

Referring to FIGS. 1 to 7, a method for manufacturing a single-panel touch panel according to the first embodiment, comprises the following steps:

Step A1: Providing a transparent conductive film 1, a bonding layer 2, and a temporary base film 3, wherein the transparent conductive film 1 is joined to upper side of the bonding layer 2, while the temporary base film 3 is joined to the lower side of the bonding layer 2.

Step A2: Patterning the transparent conductive film 1 to form a conductive pattern layer, wherein the conductive pattern layer is composed of a plurality of first major conductors 11, a plurality of second major conductors 12, a plurality of second conductive wires 13, an insulation layer 4, a plurality of first conductive wires 5, first conductive routing leads 6 and second conductive routing leads 161 (as shown in FIG. 8). To pattern the transparent conductive film 1, the step comprises:

Step A21: forming the first major conductors 11 and the second major conductors 12;

Step A22: forming the second conductive wires 13 to connect the second major conductors 12;

Step A23: forming an insulation layer 4 on the second conductive wires 13; and

Step A24: forming the first conductive wires 5 and the first conductive routing leads 6 to connect the first major conductors 11.

Step A3: Forming a protective layer 7 on the conductive pattern layer that is composed of the first major conductors 11, the second major conductors 12, the insulation layer 4, the first conductive wires 5, the first conductive routing leads 6, and second conductive routing leads.

Step A4: Coating a protective covering film 8 on the protective layer 7.

Step A5: Peeling off the temporary base film 3 to disclose the bonding layer 2, and sticking the bonding layer 2 on a planar or curvy panel (referring to the object 9 in FIG. 9).

The insulation layer 4, the first conductive wires 5, and the first conductive routing leads 6 can be formed by means of the ink-jet printing, screen-printing, PVD, or CVD. If screen-printing is employed, the thickness of both the insulation layer 4 and the first conductive wires 5 is about 0.3 μm. If ink-jet printing is employed, the thickness of both the insulation layer 4 and the first conductive wires 5 is about 1-2 μm. To achieve a thicker film, multiple processes of the ink jet printing may be used.

Figure 11:
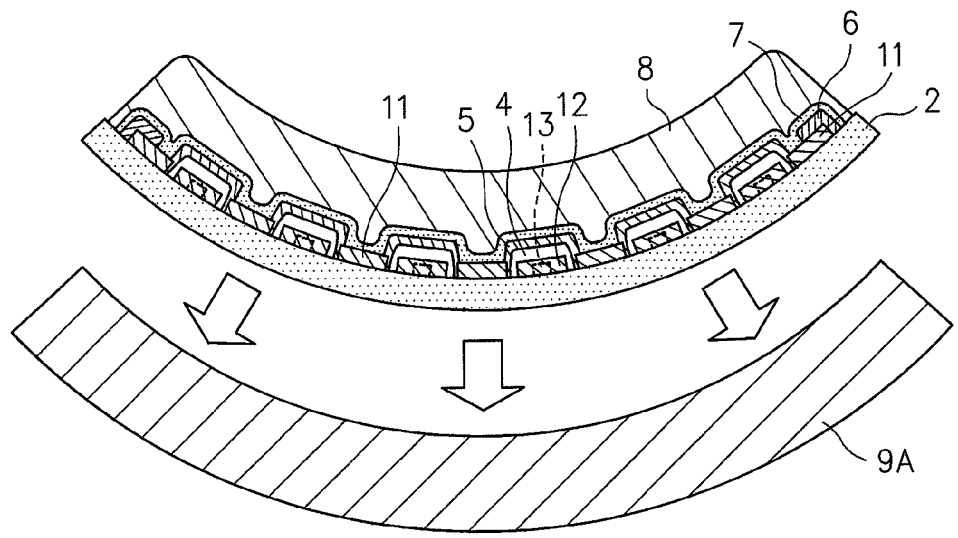
FIG. 11 schematically illustrates that bonding the conductive pattern layer onto a curvy panel according to the first embodiment.
Figure 12:
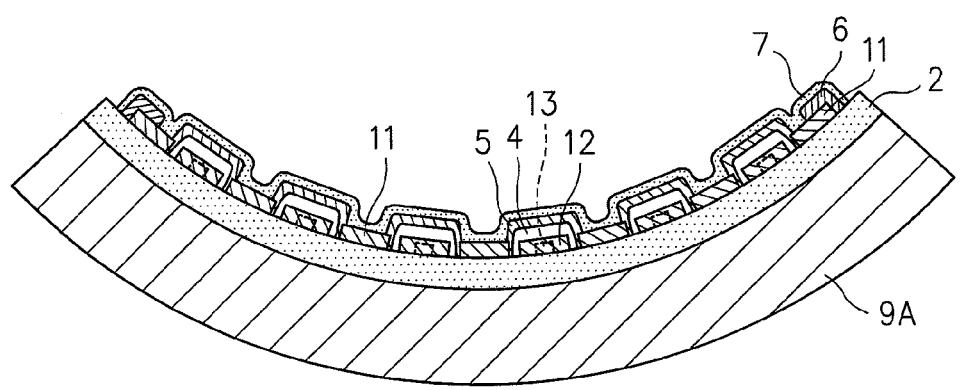
FIG. 12 shows the conductive pattern layer bonded to the curvy panel according to the first embodiment.

FIG. 11 schematically illustrates bonding the touch panel structure onto a curvy panel, according to the first embodiment of the present invention. For a concave object 9A, after the temporary base film is peeled off, the conductive pattern layer that is composed of the first major conductors 11, the second major conductors 12, the second conductive wires 13, the insulation layer 4, the first conductive wires 5, the first conductive routing leads 6, and the second conductive routing leads, can be sticked on curvy surface of the object 9A via the bonding layer 2. Then, the protective covering film 8 is peeled off, as shown in FIG. 12. In the embodiment, the conductive pattern layer of the touch panel is formed on a flexible bonding layer, so it can be sticked on a non-planar surface. Except for the concave surface shown in FIG. 11, the conductive pattern layer can be bonded onto convex, regular or non-regular curvy surfaces. Moreover, an un-patterned transparent conductive film can also be bonded onto the lower side of the bonding layer 2, so as to shield the touch devices.

Figure 13:
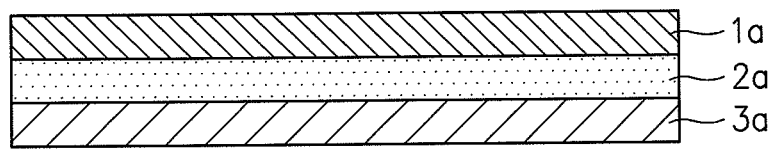
FIGS. 13 to 20 show evolutionary steps of fabrication process of a double-panel touch panel structure, according to the second embodiment of the present invention.
Figure 14:
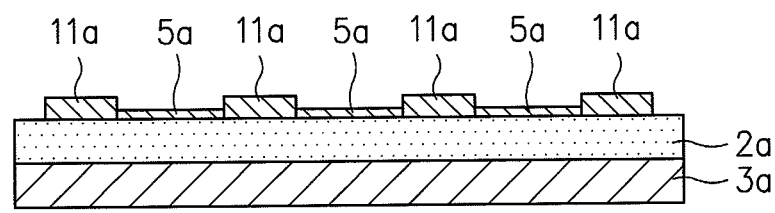
Figure 15:
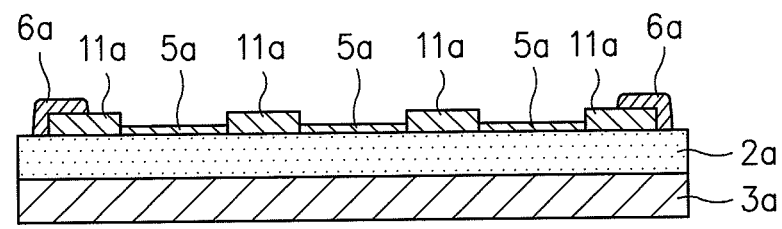
Figure 16:
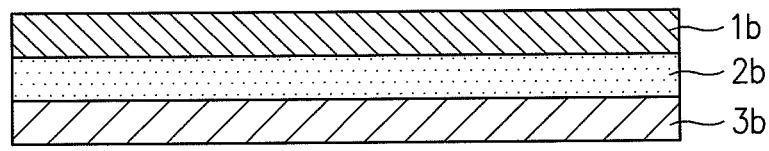
Figure 17:
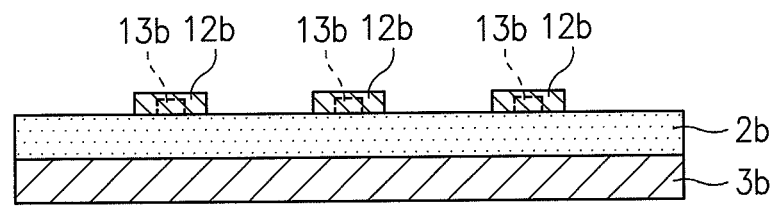
Figure 18:
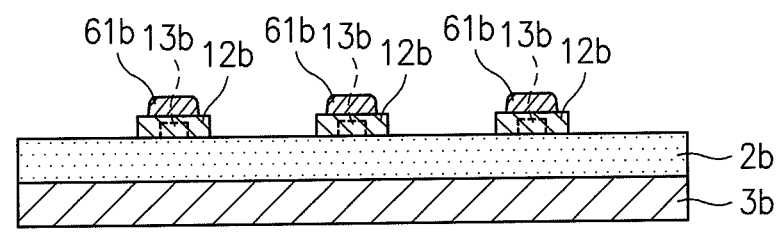

As to a double-panel touch panel, FIGS. 13 to 20 schematically illustrate evolutionary steps of fabrication process according to a second embodiment of the present invention. Referring to FIG. 13, a transparent conductive layer 1a is formed on upper side of a bonding layer 2a, which is composed of transparent photo-curing adhesive. A temporary base film 3a is joined to the lower side of the bonding layer 2a. The transparent conductive layer 1a is patterned by the wet or dry etching to form a plurality of first major conductors 11a. Between any two adjacent first major conductor elements, a first conductive wire 12a is formed by means of the ink-jet printing, screen-printing, PVD or CVD, as shown in FIG. 14. On edges of the bonding layer 2a, a plurality of first conductive routing leads 6a are formed by means of the ink-jet printing, screen-printing, PVD, or CVD, to connect electrically the first major conductors 11a, as shown in FIG. 15. Thus, the first major conductors 11a, the first conductive wires 5a, the first conductive routing leads 6a are formed on the bonding layer 2a as a first conductive pattern layer. Referring to FIG. 16, a transparent conductive layer 1b is formed on upper side of a bonding layer 2b, which is composed of transparent photo-curing adhesive. A temporary base film 3b is joined to the lower side of the bonding layer 2b. The transparent conductive layer 1b is patterned by wet or dry etching to form a plurality of second major conductors 12b and a plurality of second conductive wires 13b that connect with the second major conductors 12b, as shown in FIG. 17. On edges of the bonding layer 2b, second conductive routing leads 61b are formed by means of the ink-jet printing, screen-printing, PVD, or CVD, to connect electrically the second major conductors 12b. Thus, the second major conductors 12b, the second conductive wires 13b, the second conductive routing leads 61b are formed on the bonding layer 2b as a second conductive pattern layer, as shown in FIG. 18.

Figure 19:
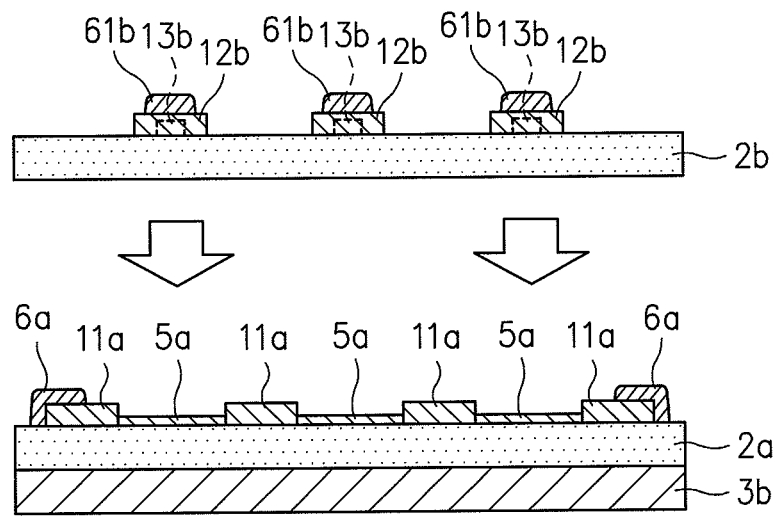
Figure 20:
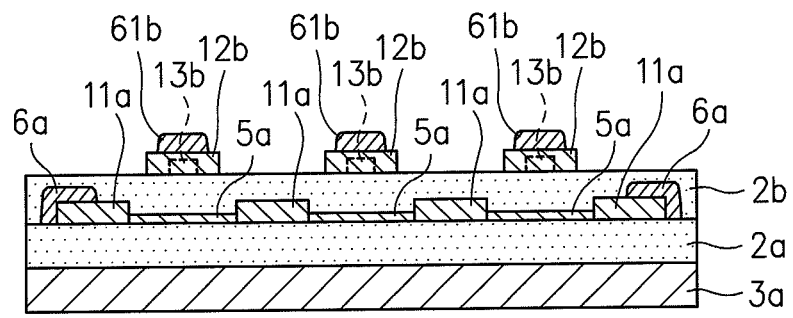

FIG. 19 schematically illustrates the step of bonding the second conductive pattern layer after peeling the temporary base film 3b off onto the first conductive pattern layer as shown in FIG. 15. Thus, the bonding layer 2b lapping over the first major conductors 11a structures as an isolation layer between the first major conductors 11a and the second major conductors 12b. Such an end item is shown in FIG. 20. It is noticed that a protective layer and a protective covering film as illustrated in FIG. 7 do not show up in the embodiment. Such a case infers that either the protective layer or the protective covering film is not indispensable and it depends on the practical situation. Moreover, each first major conductor 11a and each second major conductor 12b interlace to each other as illustrated in FIG. 21, a double-panel touch panel structure according to the second embodiment of the present invention.

Figure 21:
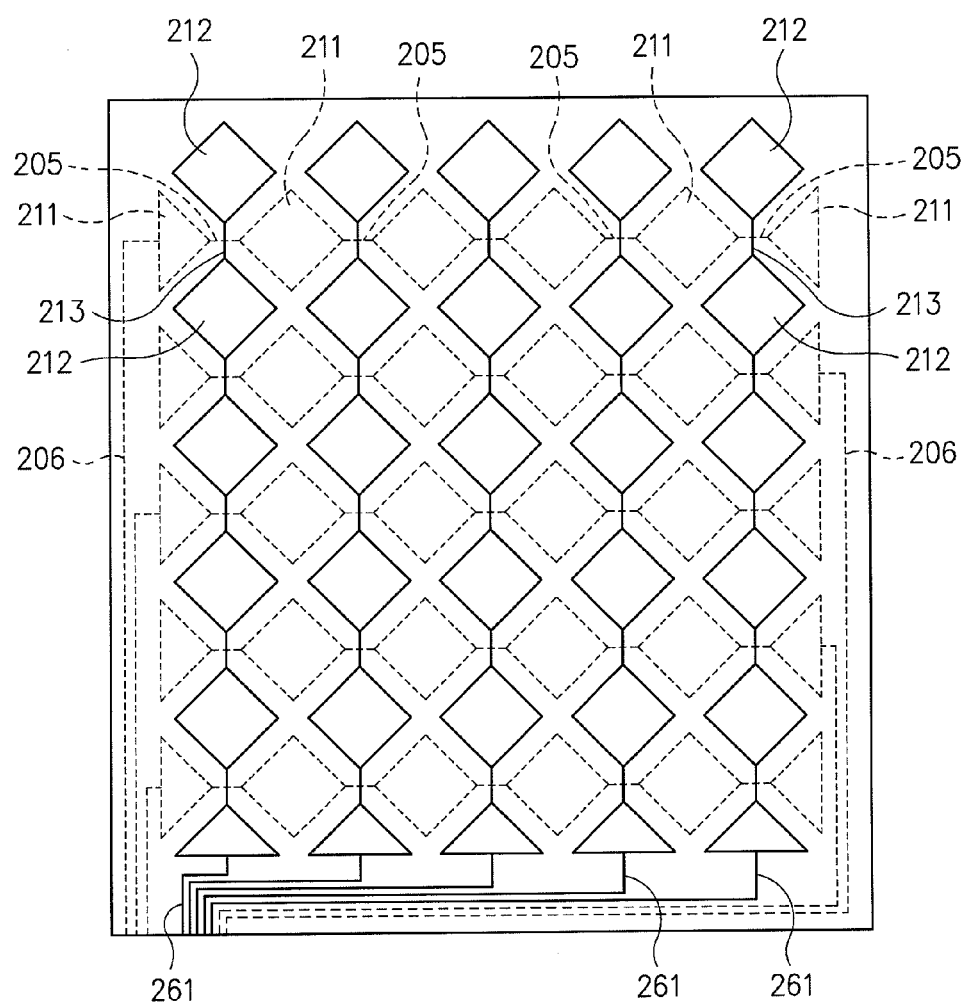
FIG. 21 shows a schematic layout of a double-panel touch panel according to the second embodiment.

FIG. 21 shows a schematic layout of a double-panel touch panel according to the second embodiment. The double-panel touch panel 200 comprises plural first major conductors 211 and plural second major conductors 212. The first major conductors 211 is composed of five rows of transverse conductor array elements, wherein the elements in each row of the array are connected via first conductive wires 205, and the edge elements of each row are connected to the first conductive routing leads 206. The first major conductors 211, the first conductive wires 205, and the first conductive routing leads 206 respectively correspond to the first major conductors 11a, the first conductive wires 5a, and the first conductive routing leads 6a in FIG. 20. Since the first major conductors 211, the first conductive wires 205, and the first conductive routing leads 206 are located in lower layers, they are indicated with dash-line in FIG. 21. On the other hand, the second major conductors 212 are composed of five columns of longitudinal conductor array elements, wherein the elements in each column of the array are connected via second conductive wires 213.

Figure 22:
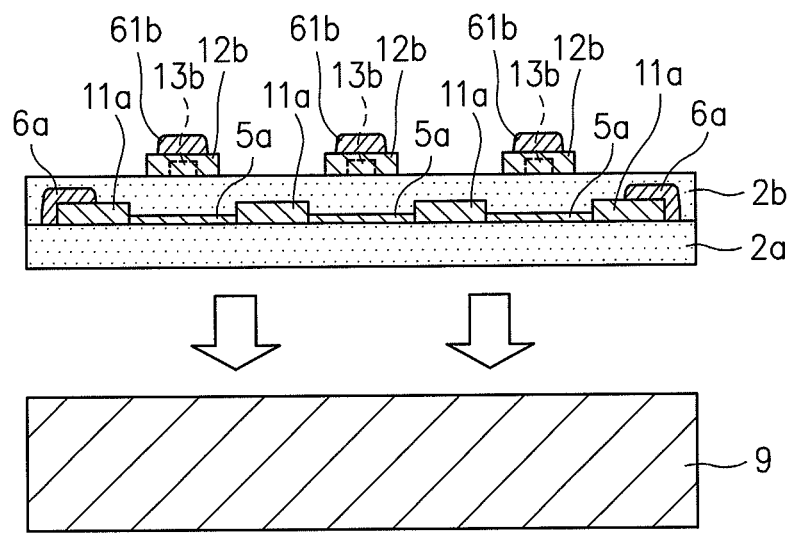
FIG. 22 schematically illustrates that bonding the conductive pattern layer onto a planar panel according to the second embodiment.
Figure 23:
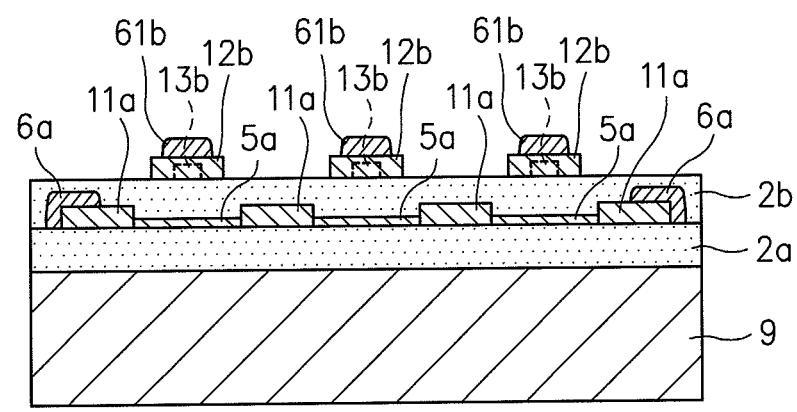
FIG. 23 shows the conductive pattern layer bonded to the planar panel according to the second embodiment.

The second conductive wires 213 and the first conductive wires 205 are located in different layers, so they do not electrically contact with each other. The second conductive routing leads 261 are disposed to connect the second major conductors 212 with external circuits. The second major conductors 212, the second conductive wires 213, and the second conductive routing leads 261 respectively correspond to the second major conductors 12b, the second conductive wires 13b, and the second conductive routing leads 61b in FIG. 20. The first conductive wires 205, the second conductive wires 213, the first conductive routing leads 206, and the second conductive routing leads 261 are formed by means of the ink-jet printing, screen-printing, PVD, or CVD. The embodiment illustrates the feasibility for the double-panel touch panel and its manufacturing method according to the present invention. FIG. 22 schematically illustrates bonding the conductive pattern layer after peeling the temporary base film 3*a* off the touch panel structure as in FIG. 20 onto the surface of an object 9. The result is shown in FIG. 23. The object 9 can be a lens, a display panel, and a glass or plastic substrate. Moreover, the object 9 can have a concave, convex, regular or non-regular curvy surface.

Referring to FIGS. 13 to 20, a method for manufacturing a double-panel touch panel according to the second embodiment, comprises the following steps:

Step B1: Providing a first transparent conductive film 1*a*, a first bonding layer 2*a*, and a first temporary base film 3*a*, wherein the first transparent conductive film 1*a* is joined to the upper side of the first bonding layer 2*a*, while the first temporary base film 3*a* is joined to the lower side of the first bonding layer 2*a*.

Step B2: Patterning the first transparent conductive film 1a to form a first conductive pattern layer, wherein the first conductive pattern layer is composed of a plurality of first major conductors 11*a*, a plurality of first conductive wires 5*a*, and first conductive routing leads 6*a*. To pattern the first transparent conductive film 1a to form the first conductive pattern layer, the steps comprises:

Step B21: forming the first major conductors 11*a*; and

Step B22: forming the first conductive wires 5*a* and the first conductive routing leads 6*a* to connect the first major conductors 11*a*.

Step B3: Providing a second transparent conductive film 1*b*, a second bonding layer 2*b*, and a second temporary base film 3*b*, wherein the second transparent conductive film 1*b* is joined to the upper side of the second bonding layer 2*b*, while the second temporary base film 3*b* is joined to the lower side.

Step B4: Patterning the second transparent conductive film 1*b* to form a second conductive pattern layer, wherein the second conductive pattern layer is composed of a plurality of second major conductors 12*b*, a plurality of second conductive wires 13*b*, and second conductive routing leads 61*b*. To pattern the second transparent conductive film 1*b* to form the second conductive pattern layer, the steps comprises:

Step B41: forming the second major conductors 12*b*;

Step B42: forming the second conductive wires 13*b* and the second conductive routing leads 61*b* to connect the second major conductors 12*b*; and then forming a protective layer 7 onto the second major conductors 12*b* and the second conductive wires 13*b*, and then coating a protective covering film on the protective layer.

Step B5: Peeling off the second temporary base film 3*b* to disclose the second bonding layer 2*b*, and sticking the second bonding layer 2*b* on the first conductive pattern layer.

From the above description, the disclosure according to the present invention provides a touch panel structure and its manufacturing method, which forms a touch-panel conductor structure layer on a bonding layer to be joined to a planar or curvy panel of arbitrary curvature, so as to lower the material and production costs, improve the production yield, and simplify the panel lamination procedures in the manufacturing process, and, furthermore, to facilitate the design of a thinner product. This invention can apply at least to single-panel and double-panel touch panels.

Figure 24:
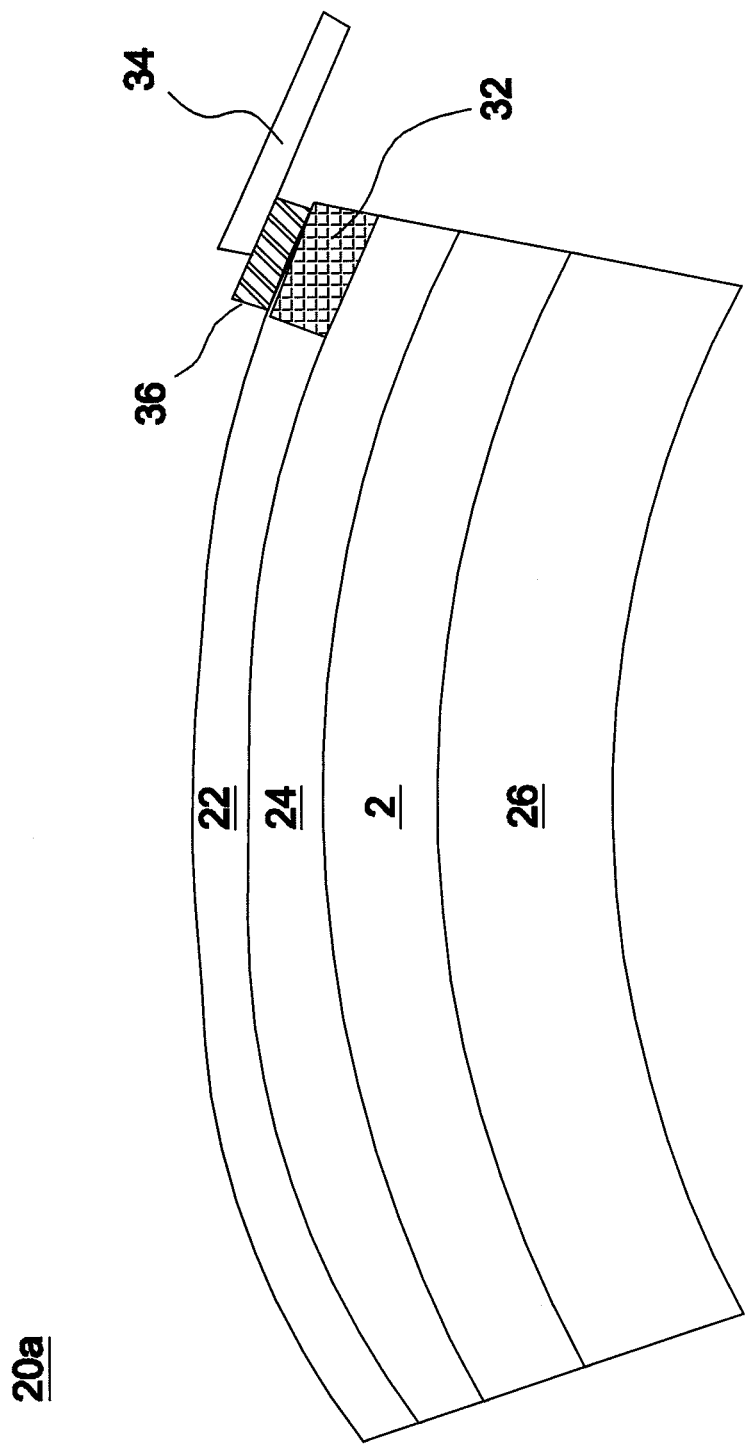
FIG. 24 shows a schematic diagram of a touch panel according to another embodiment of the invention.
Figure 25:
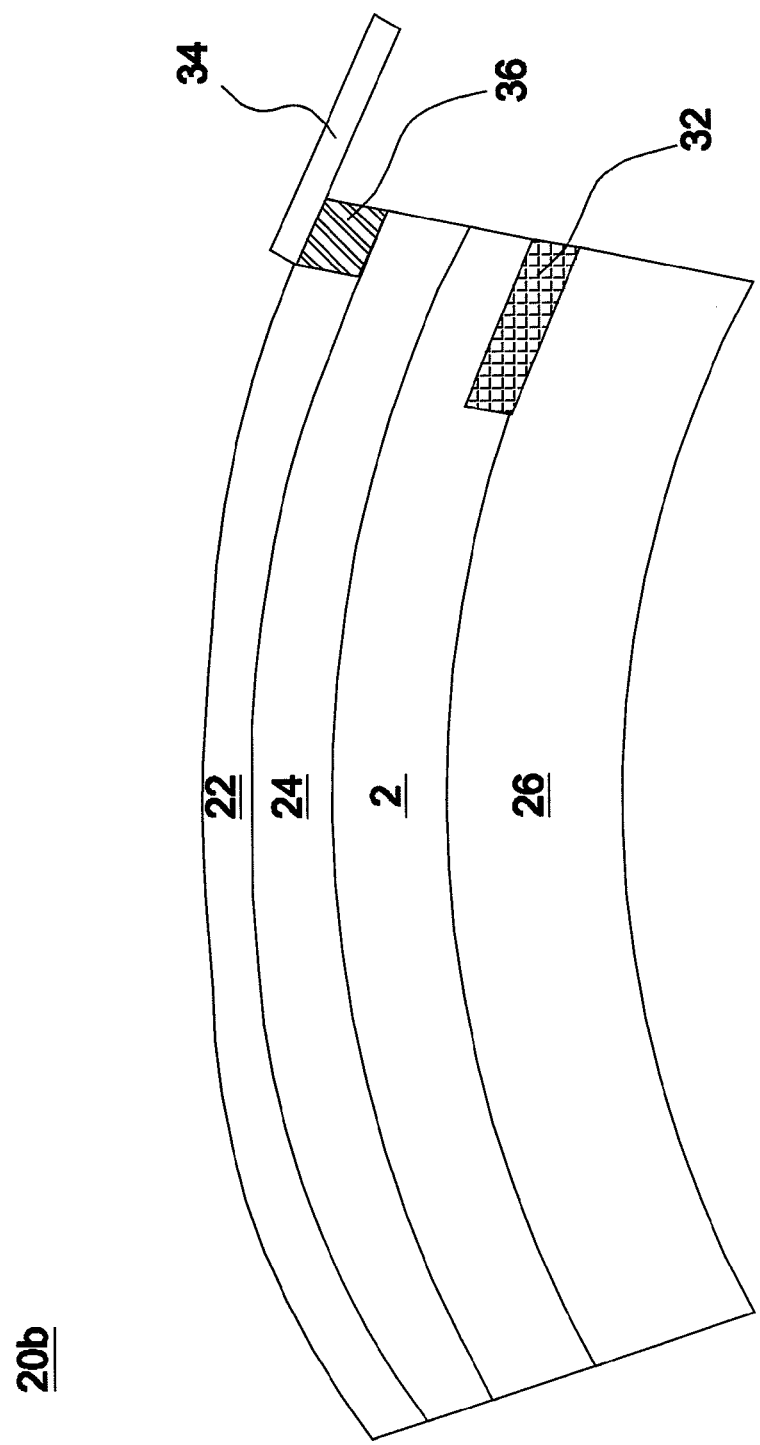
FIG. 25 shows a schematic diagram of a touch panel according to another embodiment of the invention.

FIG. 24 shows a schematic diagram of a touch panel according to another embodiment of the invention. Referring to FIG. 24, in a touch panel 20*a*, a touch-sensing electrode structure 22 is formed on a flexible substrate 24, and the flexible substrate 24 is connected to a curvy cover glass 26 via a bonding layer 2. The flexible substrate 24 may be made of ultra-thin glass or a film. The ultra-thin glass is preferably smaller than or equal to 0.1 mm, the film may be a plastic film, and the bonding layer 2 may include an optically clear adhesive. In this embodiment, a decorative layer 32 is disposed on the flexible substrate 24, a metal trace layer 36 is disposed on a periphery of the touch-sensing electrode structure 22, and the touch-sensing electrode structure 22 is electrically connected to a flexible printed circuit board 34 via the metal trace layer 36. The decorative layer 32 is, for example, disposed on a periphery of the flexible substrate 24 and may include at least one of ceramic, diamond-like carbon, color ink, photo resist and resin. In an alternate embodiment shown in FIG. 25, the decorative layer 32 is disposed on the curvy cover glass 26 of a touch panel 20*b*, and the flexible substrate 24 is connected to the curvy cover glass 26 having the decorative layer 32 via the bonding layer 2. Further, a shape of the flexible substrate 24 is substantially the same as a shape of the curvy cover glass 26. For example, the flexible substrate 24 is bent to have a curvature substantially the same as a curvature of the curvy cover glass 26. According to the above embodiments, a flexible substrate with a comparatively thin thickness (≤0.1 mm) and high flexibility may facilitate its attachment to a curvy cover glass to form a thin and compact curved-shaped touch panel.

Figure 26:
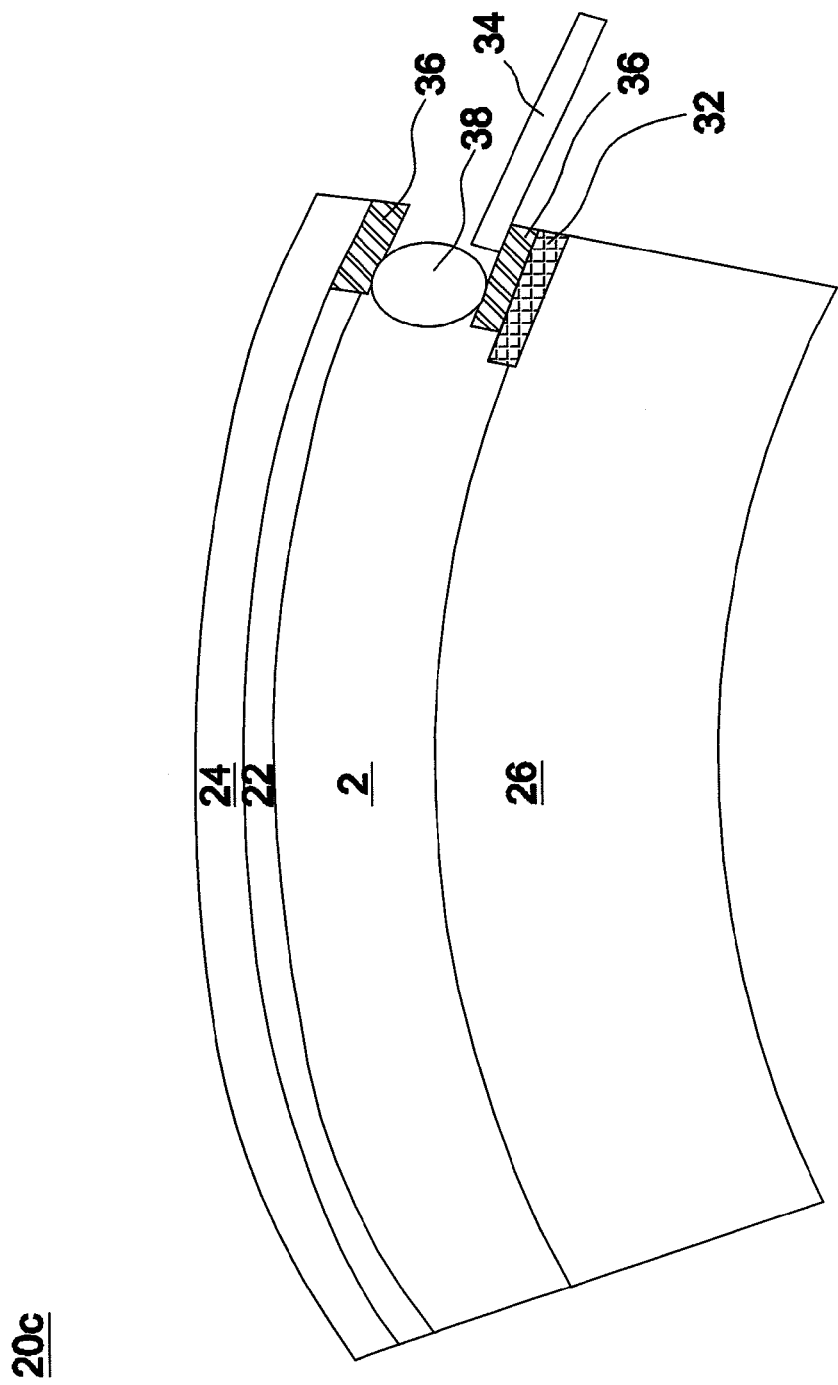
FIG. 26 shows a schematic diagram of a touch panel according to another embodiment of the invention.
Figure 27:
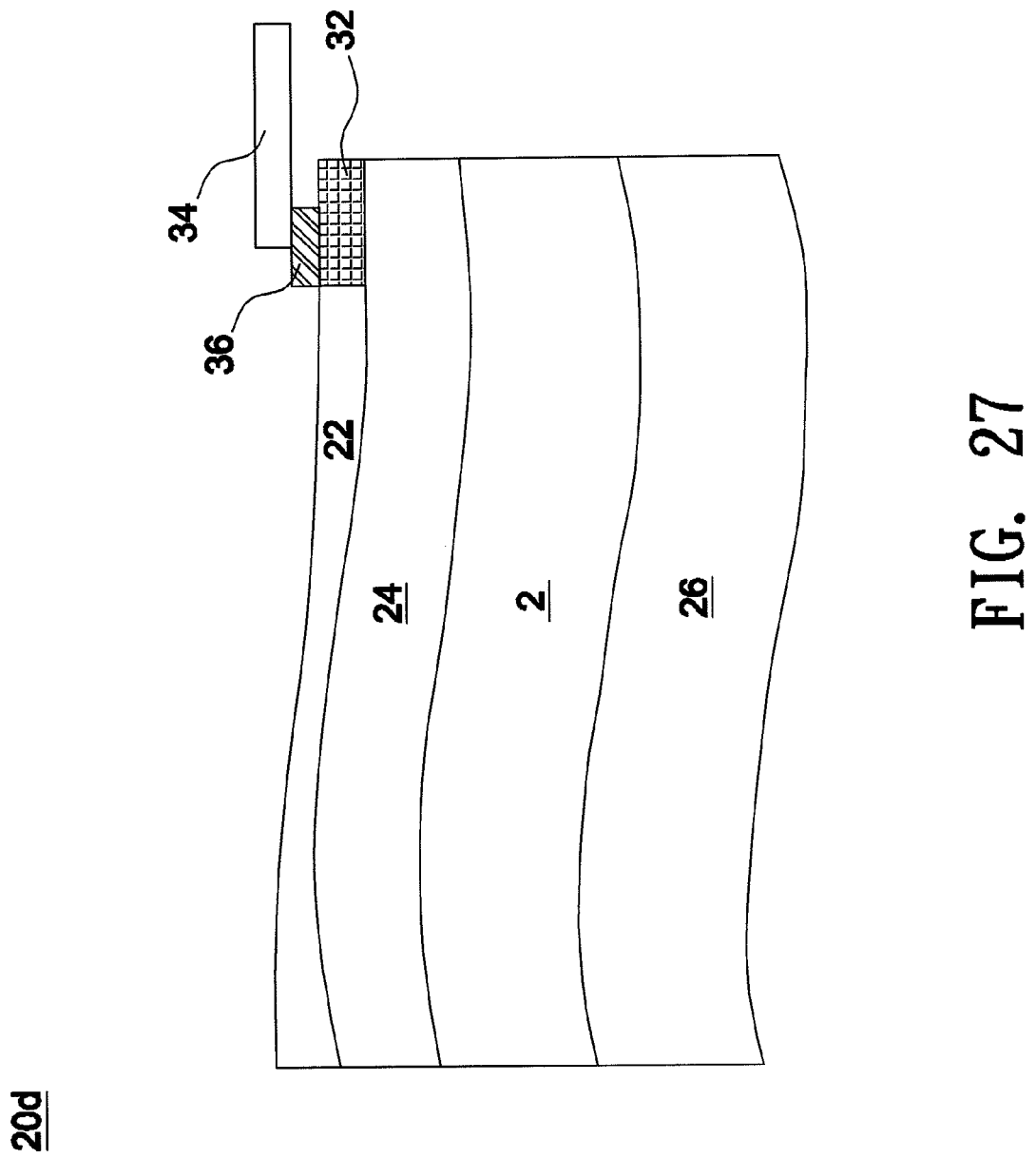
FIG. 27 shows a schematic diagram of a touch panel according to another embodiment of the invention.
Figure 28:
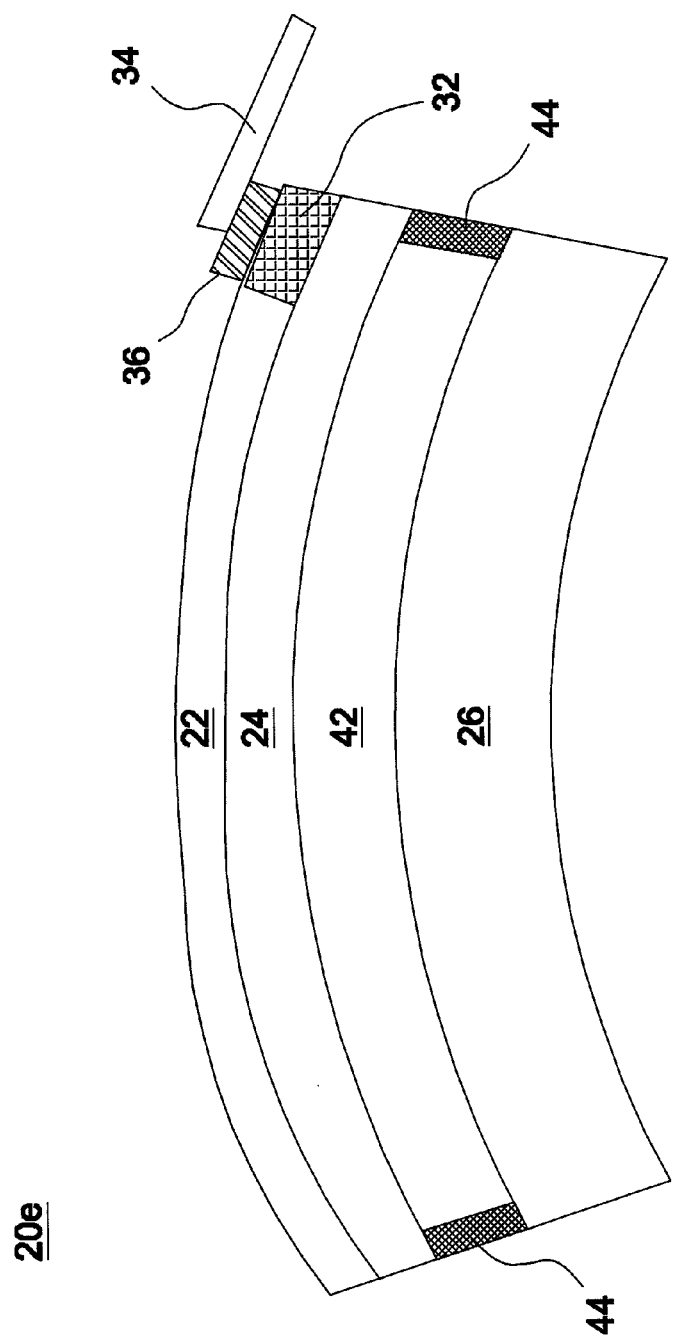
FIG. 28 shows a schematic diagram of a touch panel according to another embodiment of the invention.
Figure 29:
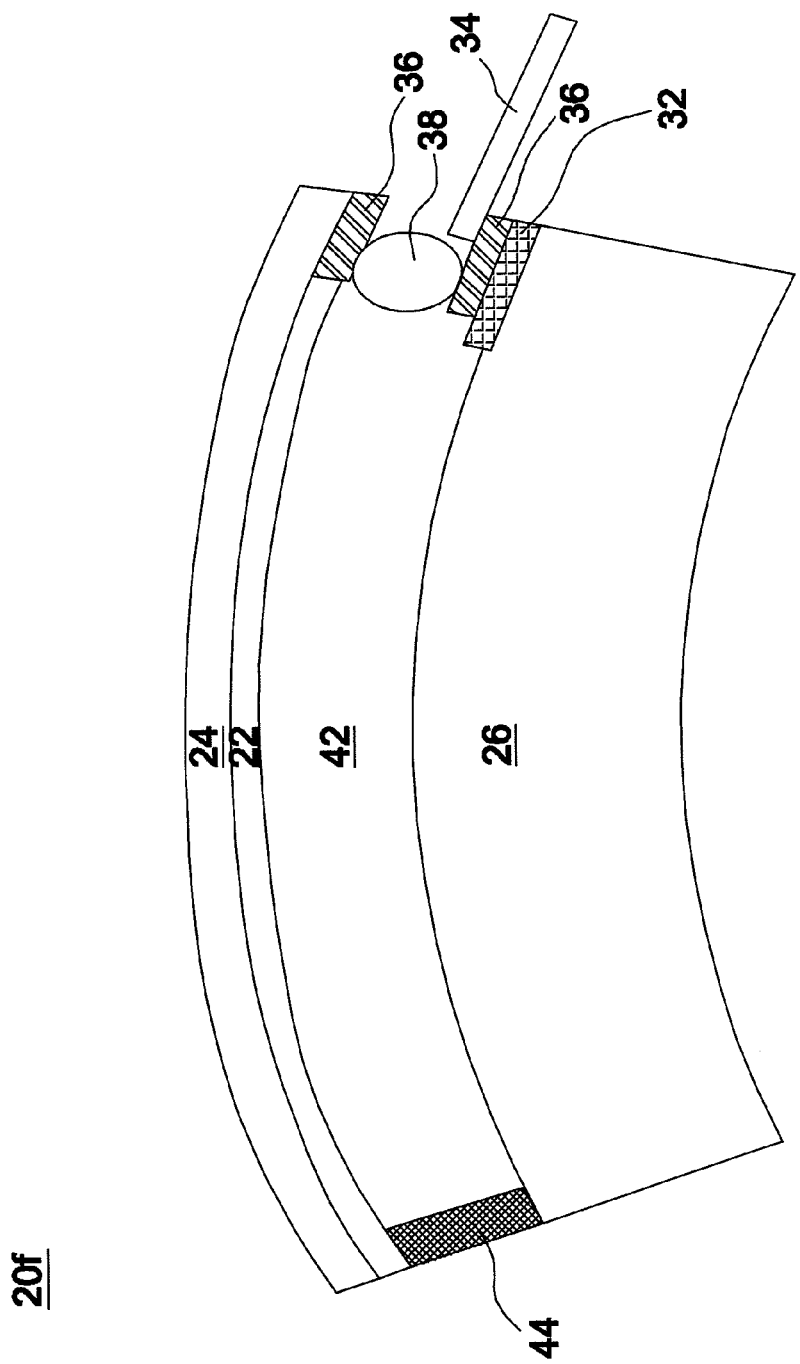
FIG. 29 shows a schematic diagram of a touch panel according to another embodiment of the invention.

FIG. 26 shows a schematic diagram of a touch panel according to another embodiment of the invention. Referring to FIG. 26, in a touch panel 20*c*, a touch-sensing electrode structure 22 is formed on one side of the flexible substrate 24 facing the curvy cover glass 26. A conductive media 38 such as a conductive spacer is disposed between the flexible substrate 24 and the curvy cover glass 26 and electrically connected with the touch-sensing electrode structure 22 and the flexible printed circuit board 34 via the metal trace layer 36, and the flexible printed circuit board 34 and the curvy cover glass 26 are bonded together. Under the circumstance, since the bonding of the flexible printed circuit board 34 is performed on the curvy cover glass 26, the flexible substrate 24 is not liable to crack or deform during the bonding process. Further, the touch panel according to different embodiments of the invention is not limited to a specific shape. For example, as shown in FIG. 27, the touch panel 20*d* may have a wavy shape, and the curvy cover glass 26 and the flexible substrate 24 (such as made of ultra-thin glass) may correspondingly have a wavy shape. In an alternate embodiment shown in FIG. 28, the flexible substrate 24 and the curvy cover glass 26 of a touch panel 20*e* are spaced apart by an air gap 42 and bonded together by a sealant 44 disposed on a periphery of the air gap 42 and surrounding the air gap 42. FIG. 29 shows a schematic diagram of a touch panel according to another embodiment of the invention. Referring to FIG. 29, in a touch panel 20*f*, the touch-sensing electrode structure 22 is formed on one side of the flexible substrate 24 facing the curvy cover glass 26, a conductive media 38 is electrically connected with the touch-sensing electrode structure 22 and the flexible printed circuit board 34, and the flexible substrate 24 and the curvy cover glass 26 are bonded together by the sealant 44.

Figure 30:
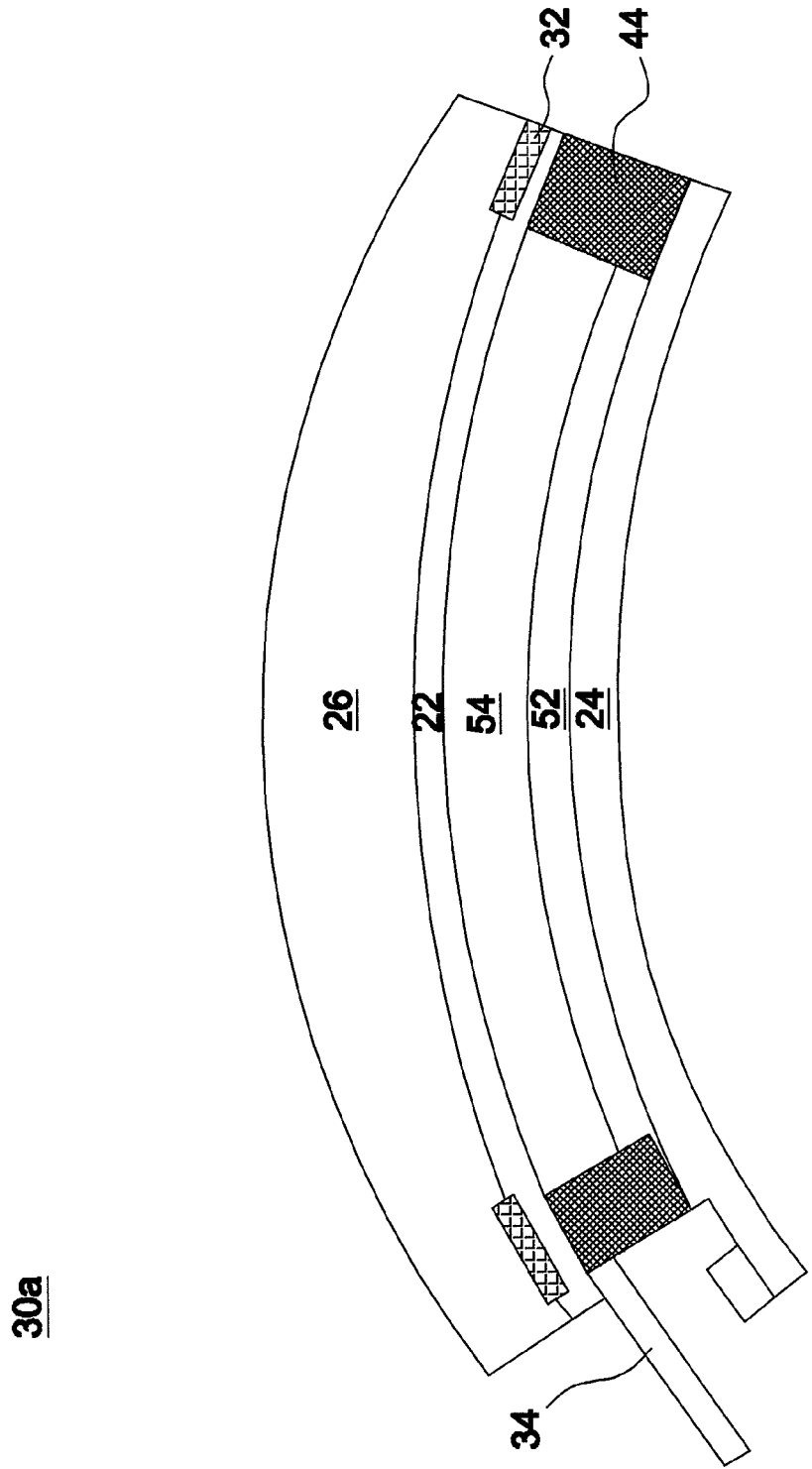
FIG. 30 shows a schematic diagram of a touch-sensitive display device according to an embodiment of the invention.
Figure 31:
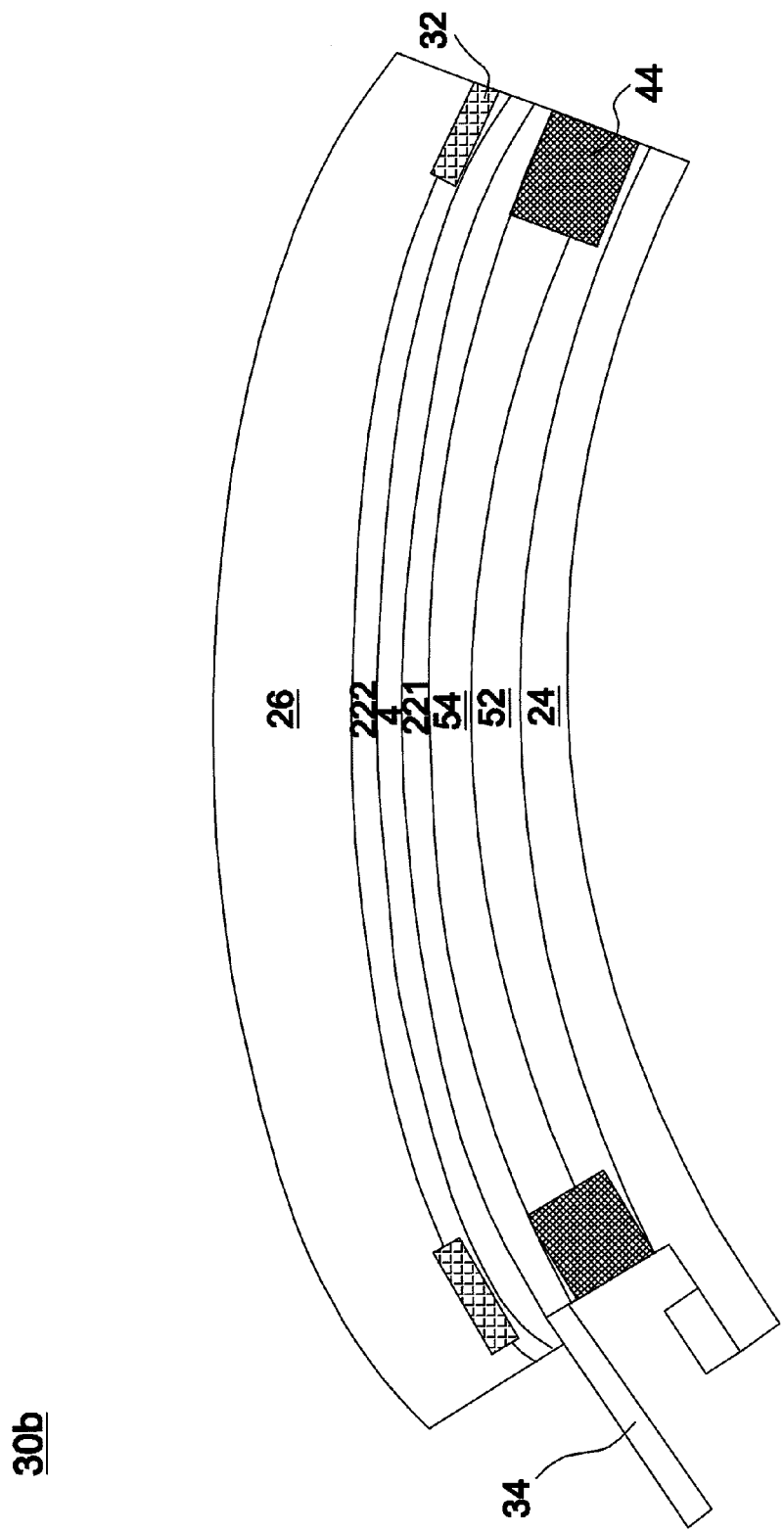
FIG. 31 shows a schematic diagram of a touch-sensitive display device according to another embodiment of the invention.

FIG. 30 shows a schematic diagram of a touch-sensitive display device according to an embodiment of the invention. Referring to FIG. 30, in a touch-sensitive display device 30*a*, an organic light-emitting diode (OLED) 52 is formed on a flexible substrate 24, and a curvy cover glass 26 covers the OLED 52. In this embodiment, the curvy cover glass 26 also serves as a sealing cap, and the curvy cover glass 26 together with a sealant 44 seals the OLED 52 between the flexible substrate 24 and the curvy cover glass 26. The touch-sensing electrode structure 22 is disposed on the curvy cover glass 26 by, for example, ink-jet printing. Further, the touch-sensing electrode structure 22 may include, but not limited to, an inorganic conductive material, a metallic conductive material, an oxide conductive material, a carbon nanotube conductive material, a nanotube fiber conductive material, a nanotube particle conductive material, a conductive polymer material, a metal polymer composite conductive material, a conductive polymer doped with a carbon compound, and a conductive polymer doped with an inorganic compound. In this embodiment, the touch-sensing electrode structure 22 is formed on one side of the curvy cover glass 26 facing the OLED 52, with a filler 54 being interposed between the touch-sensing electrode structure 22 and the OLED 52. The sealant 44 surrounds the filler 54 and seals, together with the curvy cover glass 26 the OLED 52. The flexible printed circuit board 34 is attached to the curvy cover glass 26 and electrically connected to the touch-sensing electrode structure 22. A decorative layer 32 is formed on a periphery of the curvy cover glass 26 and may include at least one of diamond like carbon, ceramic, colored ink, resin and photo resist. In this embodiment, the touch-sensing electrode structure 22 is in the form of a single-layer structure. In an alternate embodiment, the first touch-sensing electrode structure 20a may be in the form of a multi-layer structure. For example, as shown in FIG. 31, the touch-sensing electrode structure 22 of a touch-sensitive display device 30b may include first sensing series 221 (such as first major conductors 11 and first conductive wires 5 shown in FIG. 7), second sensing series 222 (such as second major conductors 12 and second conductive wires 13 shown in FIG. 7), and an insulation layer 4 (shown in FIG. 7). According to the above embodiments, since the curvy cover glass 26 also serves as a sealing cap, a sealing cap of a conventional OLED device is allowed to be omitted to further reduce the weight and thickness of a touch-sensitive display device.

Figure 32:
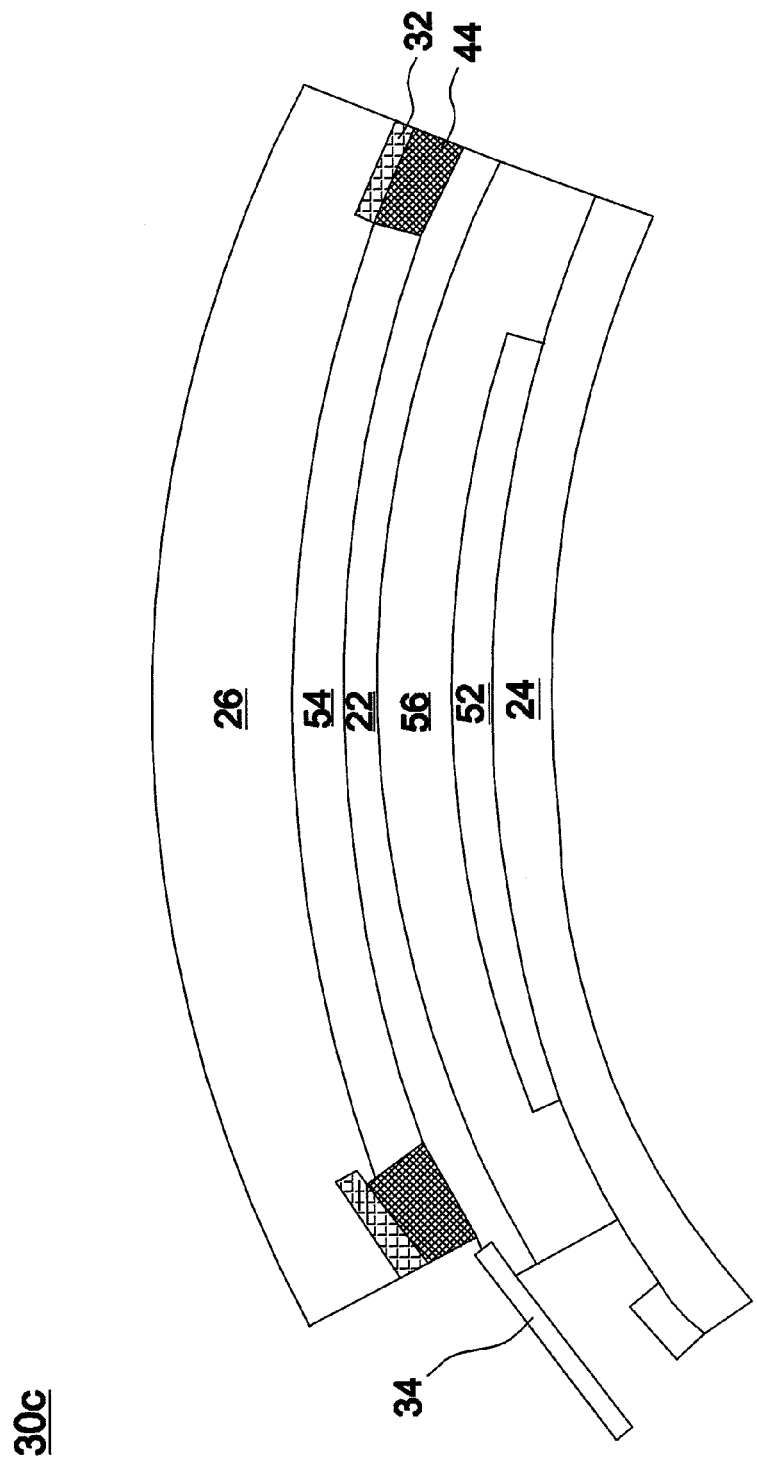
FIG. 32 shows a schematic diagram of a touch-sensitive display device according to another embodiment of the invention.

FIG. 32 shows a schematic diagram of a touch-sensitive display device according to another embodiment of the invention. Referring to FIG. 32, in a touch-sensitive display device 30c, the OLED 52 is formed on the flexible substrate 24, the passivation layer 56 is formed on the flexible substrate 24 and covers the OLED 52, and the touch-sensing electrode structure 22 is formed on the passivation layer 56. In this embodiment, the curvy cover glass 26 also serves as a sealing cap, a filler 54 is interposed between the touch-sensing electrode structure 22 and the curvy cover glass 26, and the sealant 44 surrounds the filler 54. Certainly, the touch-sensing electrode structure 22 according to this embodiment may be in the form of a single-layer structure or a multi-layer structure.

Figure 33:
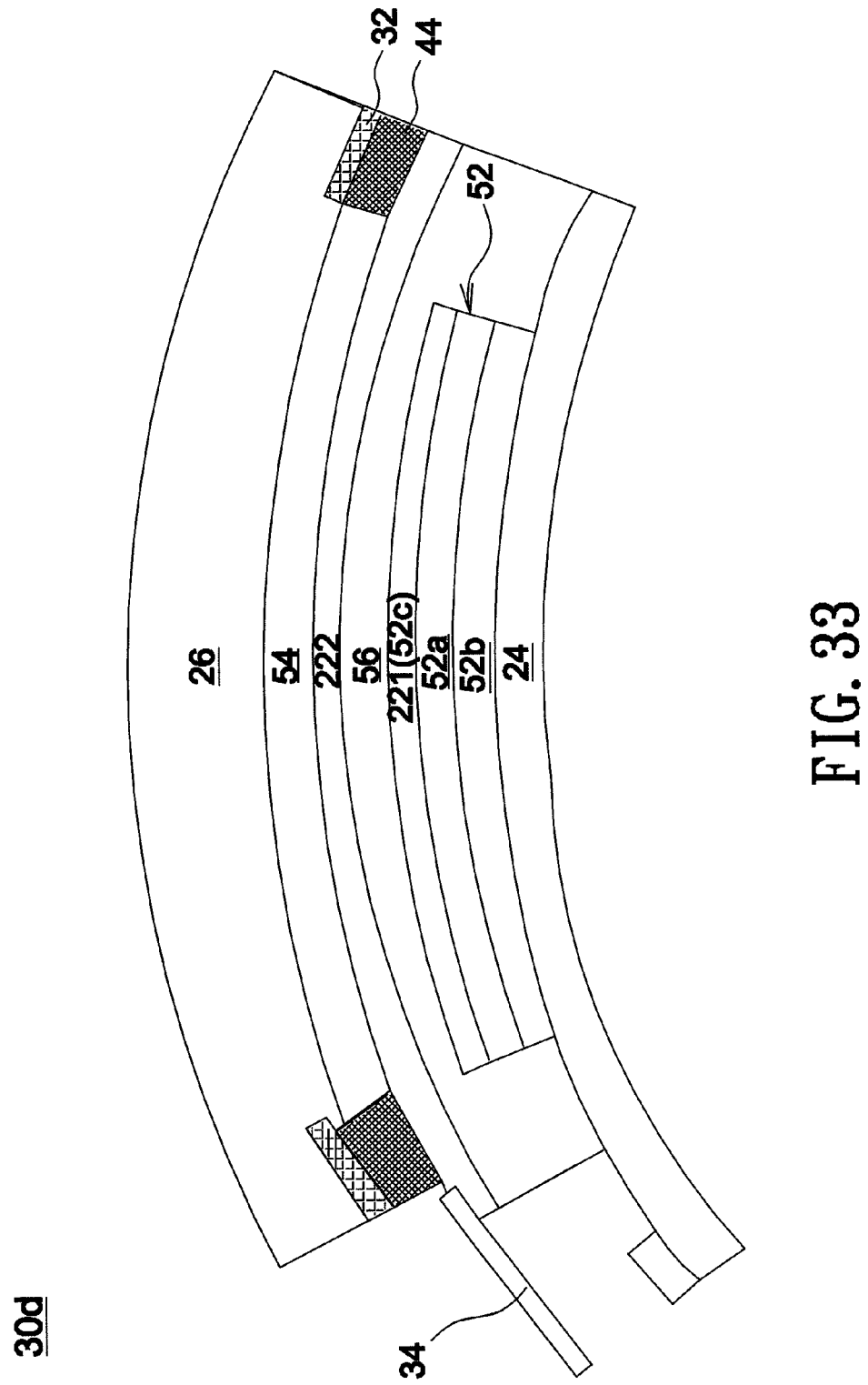
FIG. 33 shows a schematic diagram of a touch-sensitive display device according to another embodiment of the invention.
Figure 34:
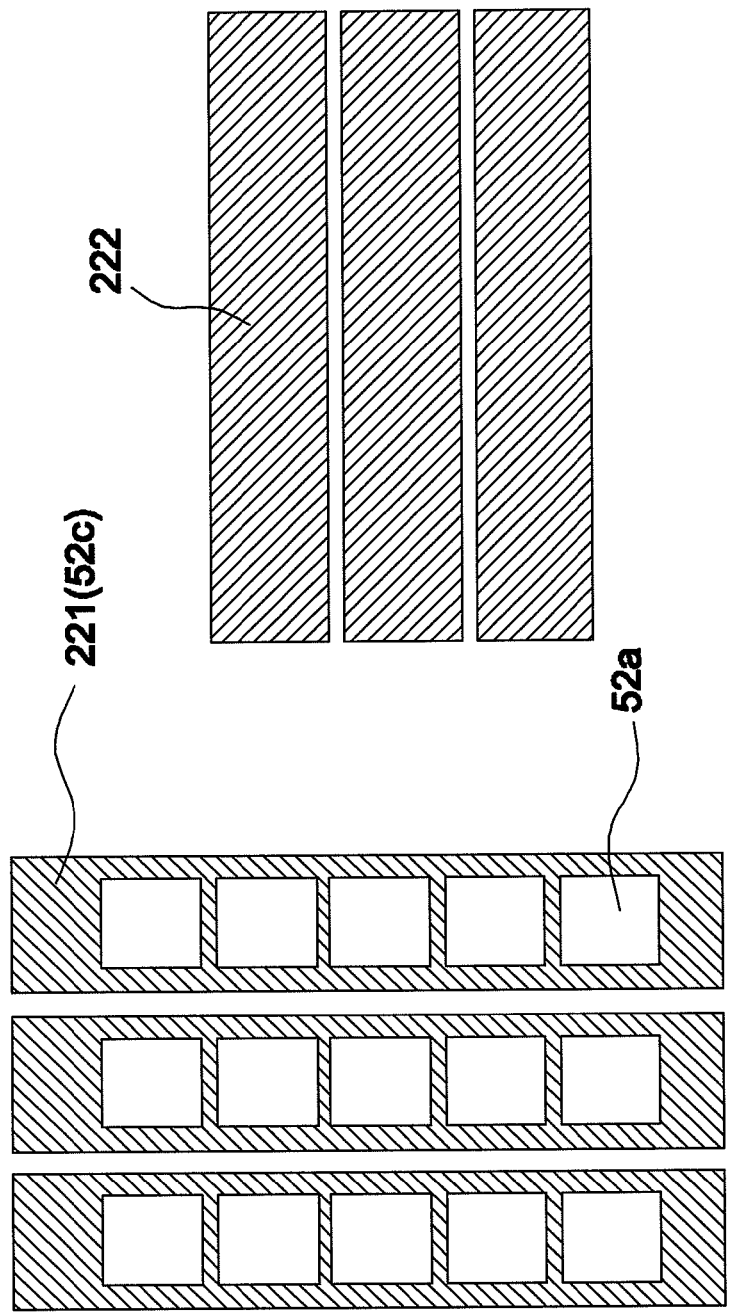
FIG. 34 shows a schematic diagram of a touch-sensing electrode structure according to an embodiment of the invention.

FIG. 33 shows a schematic diagram of a touch-sensitive display device according to another embodiment of the invention. Referring to FIG. 33, in a touch-sensitive display device 30d, the OLED 52 is formed on the flexible substrate 24, and the passivation layer 56 is formed on the flexible substrate 24 and covers the OLED 52. The OLED 52 may include a light-emitting layer 52a, an anode layer 52b and a cathode layer 52c, and the touch-sensing electrode structure 22 may include a plurality of first sensing series 221 and second sensing series 222. Please also refer to FIG. 34, in this embodiment, the cathode layer 52c of the OLED 52 is patterned to also serve as the first sensing series 221 of the touch-sensing electrode structure 22. Further, the second sensing series 222 is formed on the passivation layer 56. According to the above embodiment, since the cathode layer 52c of the OLED 52 is patterned to also serve as the first sensing series 221, the wiring of the touch-sensing electrode structure 22 is simplified to reduce fabrication complexity and costs and increase the light-transmittance of a touch-sensitive display device.

Figure 35:
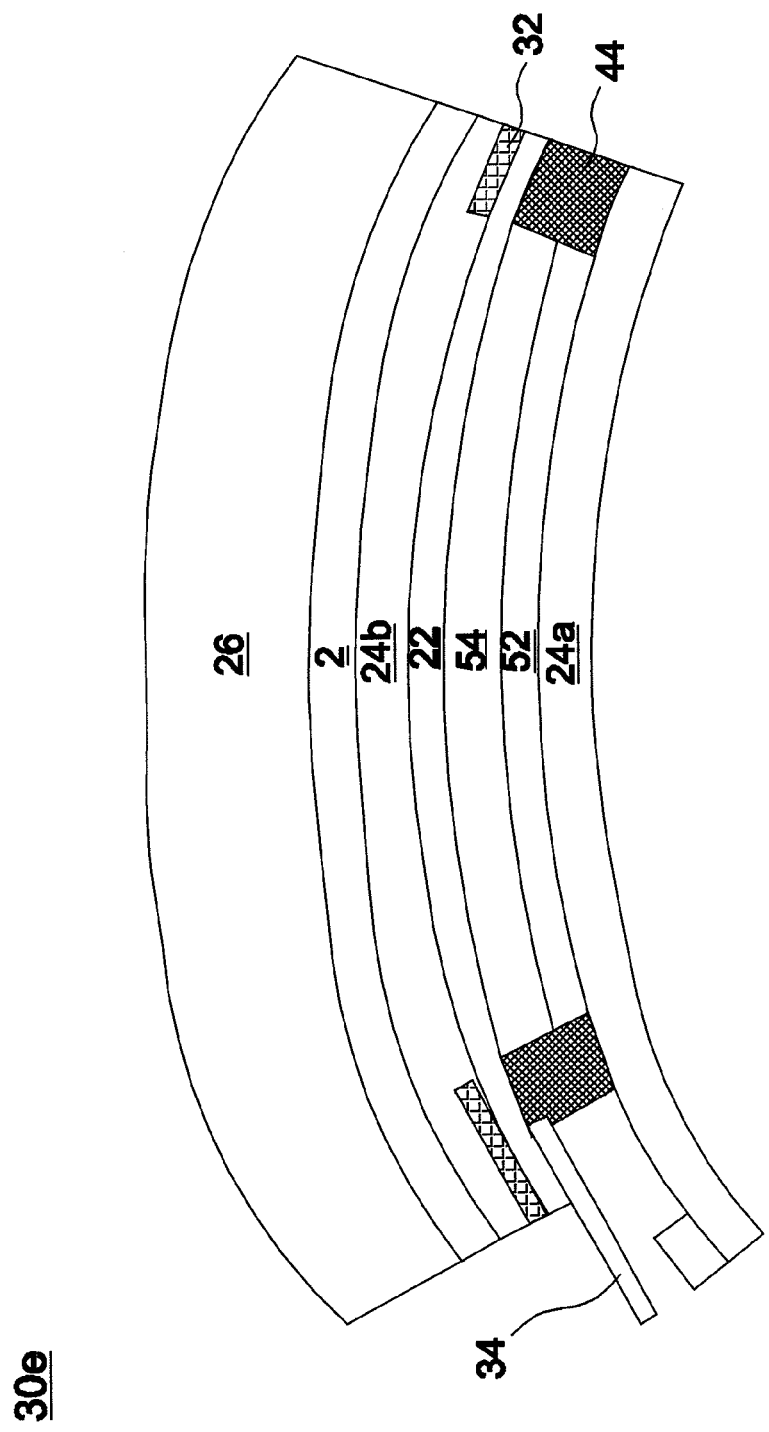
FIG. 35 shows a schematic diagram of a touch-sensitive display device according to another embodiment of the invention.
Figure 36:
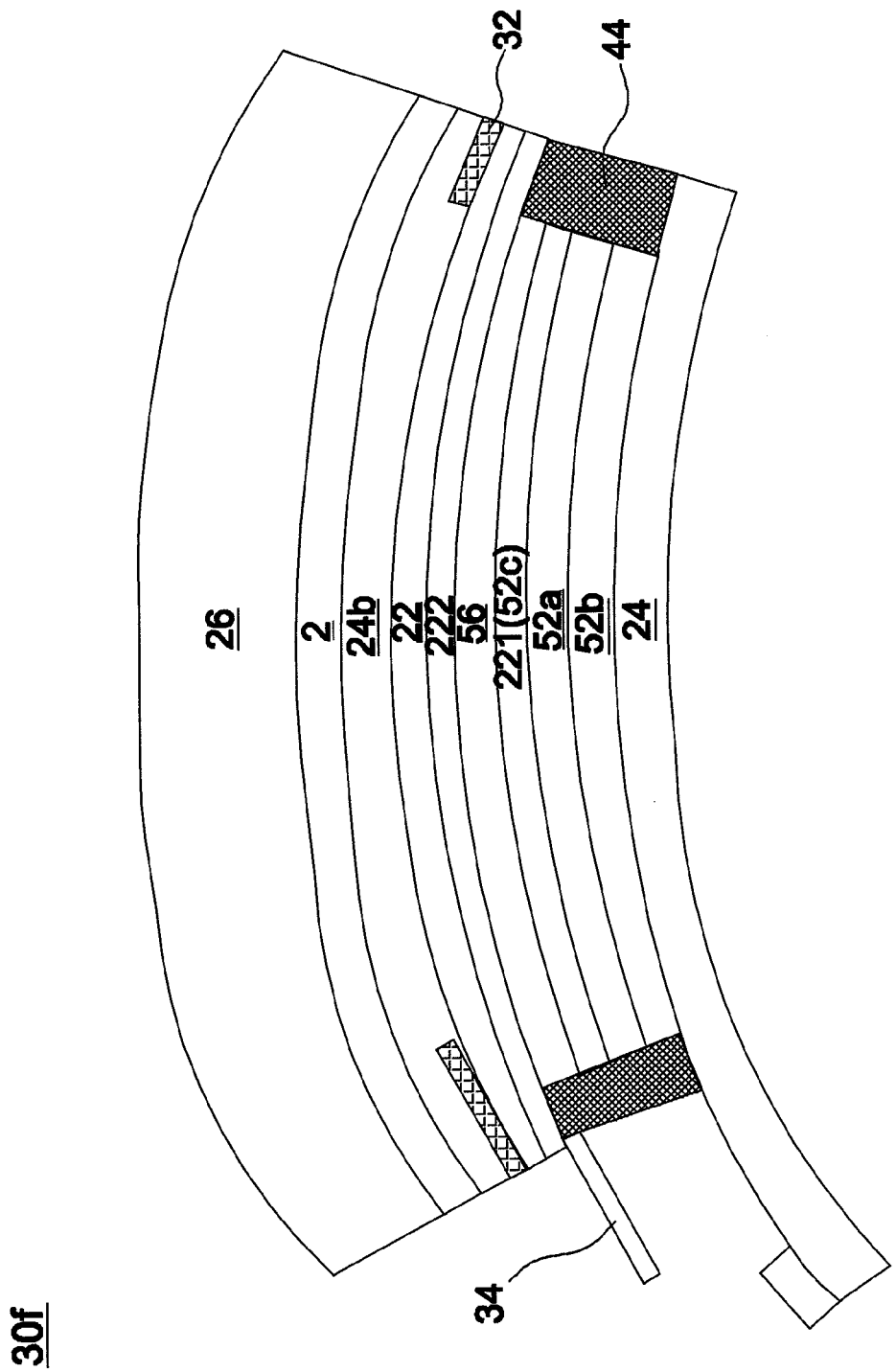
FIG. 36 shows a schematic diagram of a touch-sensitive display device according to another embodiment of the invention.

FIG. 35 shows a schematic diagram of a touch-sensitive display device according to another embodiment of the invention. Referring to FIG. 35, in a touch-sensitive display device 30e, the OLED 52 is formed on a first flexible substrate 24a, and the touch-sensing electrode structure 22 is disposed on a second flexible substrate 24b. The second flexible substrate 24b covers the organic light-emitting diode, the filler 54 is interposed between the touch-sensing electrode structure 22 and the organic light-emitting diode 52, and the sealant 44 surrounding the filler 54 and seals the organic light-emitting diode 52. The curvy cover glass 26 is connected to the second flexible substrate 24b via the bonding layer 2, and the bonding layer 2 may include an optically clear adhesive. In this embodiment, the touch-sensing electrode structure 22 is a single layer structure formed on the second flexible substrate 24b. In an alternate embodiment shown in FIG. 36, the touch-sensing electrode structure 22 of a touch-sensitive display device 30f is a multi-layer structure including a plurality of first sensing series 221 and second sensing series 222, and the first sensing series 221 and the second sensing series 222 are spaced apart by the passivation layer 56. The first sensing series 221 may also serve as a cathode layer 52c of the organic light-emitting diode 52.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A touch panel, comprising:
   a flexible substrate;
   a touch-sensing electrode structure formed on the flexible substrate; and
   a curvy cover glass connected to the flexible substrate and the touch-sensing electrode structure via a bonding layer, wherein the flexible substrate, the touch-sensing electrode structure and the curvy cover glass are arranged in order, with the touch-sensing electrode structure being located between the flexible substrate and the curvy cover glass.

2. The touch panel as claimed in claim 1, wherein the flexible substrate is made of ultra-thin glass or a film.

3. The touch panel as claimed in claim 1, wherein a shape of the flexible substrate is substantially the same as a shape of the curvy cover glass.

4. The touch panel as claimed in claim 1, wherein the curvy cover glass has a wavy shape.

5. The touch panel as claimed in claim 1, wherein the bonding layer comprises an optically clear adhesive.

6. The touch panel as claimed in claim 1, wherein the bonding layer comprises an air gap and a sealant surrounding the air gap.

7. The touch panel as claimed in claim 1, further comprising:
   a decorative layer disposed on the flexible substrate or the curvy cover glass.

8. The touch panel as claimed in claim 7, wherein the decorative layer comprises at least one of ceramic, diamond-like carbon, color ink, photo resist and resin.

9. The touch panel as claimed in claim 1, further comprising:

a metal trace layer electrically connected to the touch-sensing electrode structure; and a flexible printed circuit board electrically connected to the metal trace layer.

10. The touch panel as claimed in claim 9, wherein the touch panel further comprising a conductive media disposed between the flexible substrate and the curvy cover glass and electrically connected with the touch-sensing electrode structure and the flexible printed circuit board.

11. A touch-sensitive display device, comprising:
a flexible substrate;
an organic light-emitting diode formed on the flexible substrate;
a curvy cover glass covering the organic light-emitting diode; and
a touch-sensing electrode structure disposed between the organic light-emitting diode and the curvy cover glass, wherein the flexible substrate, the touch-sensing electrode structure and the curvy cover glass are arranged in order.

12. The touch-sensitive display device as claimed in claim 11, wherein the touch-sensing electrode structure is in the form of a single-layer structure or a multi-layer structure.

13. The touch-sensitive display device as claimed in claim 11, wherein the flexible substrate is made of ultra-thin glass or a film.

14. The touch-sensitive display device as claimed in claim 11, further comprising:
a filler interposed between the touch-sensing electrode structure and the organic light-emitting diode; and
a sealant surrounding the filler and sealing the organic light-emitting diode.

15. The touch-sensitive display device as claimed in claim 11, further comprising:
a passivation layer formed on the flexible substrate and covering the organic light-emitting diode, wherein the touch-sensing electrode structure is formed on the passivation layer.

16. The touch-sensitive display device as claimed in claim 15, further comprising:
a filler interposed between the touch-sensing electrode structure and the curvy cover glass; and
a sealant surrounding the filler.

17. The touch-sensitive display device as claimed in claim 11, wherein the touch-sensing electrode structure comprises a plurality of first sensing series and second sensing series, wherein the first sensing series serve as a cathode layer of the organic light-emitting diode.

18. The touch-sensitive display device as claimed in claim 17, wherein the second sensing series are formed on the curvy cover glass.

19. The touch-sensitive display device as claimed in claim 17, further comprising:
a passivation layer formed on the flexible substrate and covering the organic light-emitting diode, wherein the touch-sensing electrode structure is formed on the passivation layer.

20. A touch-sensitive display device, comprising:
a first flexible substrate;
an organic light-emitting diode formed on the first flexible substrate;
a second flexible substrate covering the organic light-emitting diode;
a touch-sensing electrode structure disposed on the second flexible substrate; and
a curvy cover glass connected to the second flexible substrate via a bonding layer, wherein the touch-sensing electrode structure is disposed between the organic light-emitting diode and the curvy cover glass.

21. The touch-sensitive display device as claimed in claim 20, wherein the touch-sensing electrode structure is in the form of a single-layer structure or a multi-layer structure.

22. The touch-sensitive display device as claimed in claim 20, wherein the bonding layer comprises an optically clear adhesive.

23. The touch-sensitive display device as claimed in claim 20, further comprising:
a filler interposed between the touch-sensing electrode structure and the organic light-emitting diode; and
a sealant surrounding the filler.

24. The touch-sensitive display device as claimed in claim 20, wherein the touch-sensing electrode structure comprises a plurality of first sensing series and second sensing series, wherein the first sensing series serve as a cathode layer of the organic light-emitting diode.

* * * * *